United States Patent [19]
Toyoda et al.

[11] Patent Number: 6,039,808
[45] Date of Patent: Mar. 21, 2000

[54] CVD APPARATUS FOR CU FORMATION

[75] Inventors: Yoshihiko Toyoda; Tetsuo Fukada; Takeshi Mori; Makiko Hasegawa, all of Hyogo, Japan

[73] Assignee: Mitsubishi Denki Kabushiki Kaisha, Tokyo, Japan

[21] Appl. No.: 09/042,693

[22] Filed: Mar. 17, 1998

[30] Foreign Application Priority Data

Mar. 18, 1997 [JP] Japan .................................. 9-064232

[51] Int. Cl.⁷ .......................... C23C 16/06; C23C 16/18
[52] U.S. Cl. ........................................ 118/715; 118/726
[58] Field of Search ................................ 118/715, 726

[56] References Cited

U.S. PATENT DOCUMENTS

| | | | |
|---|---|---|---|
| 5,009,963 | 4/1991 | Ohmi et al. | 118/726 X |
| 5,622,565 | 4/1997 | Ye et al. | 118/726 X |

OTHER PUBLICATIONS

"CVD of Copper from Copper (II) . . . " E. Eisenbraun et al. Advanced Metallization for ULSI Applications, pp. 107–113 (1992).

"Chemical Additives for Improved Copper . . . " Arthur K. Hochberg et al., Advanced Metallization for ULSI Applications in 1994, pp. 79–87.

"Interconnection Process Employing Damascene Method" H. Shibata, Semiconductor World (monthly issued), Dec. 1995, pp. 179–184.

*Primary Examiner*—Leo B. Tentoni
*Attorney, Agent, or Firm*—McDermott, Will & Emery

[57] ABSTRACT

In a CVD apparatus for Cu formation using as a raw material, a mixture of a solvent and a liquid raw material including Cu(HFA) and adducted molecules or a solid raw material including Cu(HFA) and adducted molecules, a fluorinated organic polymer contained, a fluorinated metal, an insulator or a Ti compound is provided on a surface of a member at a portion where the raw material exists.

5 Claims, 3 Drawing Sheets

CVD APPARATUS FOR CU FORMATION

BACKGROUND OF THE INVENTION

1. Field of the Invention

The present invention relates to a CVD (Chemical Vapor Deposition) apparatus for Cu formation.

2. Description of the Background Art

Conventionally, material containing Al with Cu added thereto has been used as an interconnection material for LSIs. Interconnection formed of pure Al has short electromigration lifetime, resulting in unsatisfactory reliability. Therefore, Cu is added to Al to improve reliability. General concentration of Cu is about 0.5 wt %. This value is selected since, with this concentration, electromigration lifetime is significantly improved, increase in resistivity is relatively small and Cu residue is not observed in processing utilizing Reactive Ion Etching (RIE).

It has been generally considered that electromigration lifetime is inversely proportional to the square of current density. As the degree of integration of LSIs has been ever increasing, cross section of a line or interconnection has been decreased, and current density has been increased. Therefore, there has been ever increasing demand for higher electromigration resistance. Further, since the cross section of a line decreases as the degree of integration of LSIs has been increasing, line resistance and line RC delay are also increased. As a result, it is expected that line RC delay will affect speed of operation of the devices of a generation having the line width of 0.15 µm or smaller. It has been increasingly difficult for currently used AlCu alloy to solve these problems. Cu has as low a resistivity as about 70% that of pure Al, and has electromigration lifetime longer by about three orders than AlCu. Therefore, Cu is considered a promising material for interconnections for the generation of 0.15 µm or smaller.

In the Cu interconnection process, processing or treatment of Cu has been an essential problem, since conventional RIE is difficult as vapor pressure of Cu chloride is extremely low. Therefore, a process called Damascene process is adopted for forming Cu interconnection in place of the process employing RIE. The Damascene process is described, for example, in "Interconnection Process Employing Damascene Method" published in monthly magazine *Semiconductor World*, December, 1995.

In the Damascene process, a trench is formed in an insulating film, the trench is filled by a metal (Cu), and the metal (Cu) formed on portions other than the trench is removed, for example, by Chemical Mechanical Polishing (CMP). At this time, it is necessary to fill the trench fully with Cu. Conventional sputtering cannot attain sufficient filling, thereby causing disconnection or unsatisfactory reliability. In order to fill the trench with Cu, a CVD method having superior filling characteristic is necessary.

Characteristic required of a CVD raw material includes that the material has high vapor pressure, allows deposition of highly pure metal Cu and that the material is liquid or gas. Very few material satisfy such conditions. Generally, Cu(HFA) with adducted organic molecules is used where HFA means Hexafluoroacetylacetonate. A typical example includes Cu(HFA)(TMVS), or Hexafluoroacetylacetonate Copper Trimethylvinyl Silane adduct, which is expressed by the following molecular expression (1) and has molecular structure such as shown in FIG. 6.

$$Cu[(CF_3CO)_2CH] \cdot CH_2=CHSi(CH_3)_3 \quad (1)$$

Cu (HFA)(TMVS) is an organic material having relatively high vapor pressure and is in liquid phase at a normal temperature. Reaction proceeds in accordance with disproportination as represented by the following expression (2), and hence a film having high purity is obtained.

$$2Cu(HFA)(TMVS) \rightarrow \leftarrow Cu + Cu(HFA)_2 + 2TMVS \quad (2)$$

Since Cu(HFA)(TMVS) is liquid at a normal temperature, bubbling or direct liquid injection is employed for raw material supply. In bubbling method, the liquid is vaporized by heating a source container. A carrier gas is introduced to the source container, and the vaporized raw material is introduced to a chamber. The supply of the raw material is determined by the heating temperature of the source container and a flow rate of the carrier gas. In the direct liquid injection method, the flow rate of the liquid raw material is controlled by a liquid mass flow controller or by a pump, and the raw material is guided to a vaporizer. The raw material is vaporized in the vaporizer (which heats in vacuum), mixed with the carrier gas, and then introduced to the chamber.

By employing the method described above, it is possible to exactly control the flow rate. Further, unlike bubbling, it is not necessary to heat the source container, and hence degradation of the raw material caused by heat can be avoided. In either of the supplying methods described above, portions of delivery system, valve, shower head and so on through which the vaporized raw material passes are kept at approximately the same temperature as the evaporating temperature, so as to prevent liquefaction of the raw material in gas phase. Further, walls of the chamber, exhaust lines and an exhaust pump are heated to prevent liquefaction of the raw material and deposition of resulting substances such as $Cu(HFA)_2$ or TMVS. Generally, SUS (stainless steel) is used for the source container, liquid mass flow controller, pump, vaporizer, delivery system, valves and shower head.

However, Cu deposition reaction quickly proceeds when the raw material such as described above is employed, and the reaction is initiated simply by the presence of the raw material. Therefore, there arises a problem that a substance resulting from the reaction, such as Cu or $Cu(HFA)_2$ tends to be deposited on the surfaces of the delivery system and the chamber. Such substance resulting from the reaction may cause particles, deteriorating production yield of interconnections and making shorter the period for maintenance.

SUMMARY OF THE INVENTION

The present invention was made to solve the above described problems. An object of the present invention is to provide a CVD apparatus for Cu formation which can effectively suppress deposition of a substance resulting from a reaction on surfaces of delivery system, chamber and so on.

The CVD apparatus in accordance with the present invention is for forming Cu film, using as a raw material, a mixture of a liquid material containing Cu(HFA) and adducted molecules, or a solid material containing Cu(HFA) and adducted molecules, and a solvent. The present invention is characterized in that on portions of members where the aforementioned materials exist, a fluorinated organic polymer contained, a fluorinated metal, an insulator or a Ti compound exists.

As described above, in the CVD apparatus in accordance with the present invention, the surface of a member where the raw material exists is provided with a fluorinated organic polymer combined, a fluorinated metal, an insulator or a Ti compound. When a substance such as the fluorinated organic polymer contained is used as an underlying layer, deposition of a substance such as Cu resulting from the reaction on the underlying layer of such substance can effectively be suppressed as can be seen from Table 1 or FIG. 4. Therefore, generation of particles can effectively be suppressed and, accordingly, decrease in production yield of interconnections derived from the generated particles can effectively be suppressed. Further, maintenance period for the vaporizer and delivery system is elongated.

The CVD apparatus for Cu formation described above includes, as a portion where the raw material exists, at least one component selected from the group consisting of a source container, delivery system through which the raw material flows, a valve, a mass flow controller, a vaporizer, a shower head, a chamber, an exhaust line and a pump. Preferably, inner surface of each of the aforementioned components is coated with a fluorinated organic polymer contained, a fluorinated metal, an insulator, Ti or a Ti compound.

Since the surface of at least one of the source container, the delivery system through which the raw material flows, the valve, the mass flow controller or pump for liquid delivery, the vaporizer, the shower head, the chamber (film forming chamber), the exhausting line and the pump is covered by a fluorinated organic polymer contained, a fluorinated metal, an insulator, Ti or a Ti compound, deposition of the substance resulting from the reaction on the surface of such component can effectively be suppressed.

The fluorinated organic polymer contained includes polytetrafluoroethylene, the fluorinated metal includes fluoride of Al or Ti, the insulator includes $Al_2O_3$, $SiO_2$, $Cr_2O_3$, AlN and SiN, and Ti compound includes $TiO_2$ and TiN.

The above described effects can be provided by the use of these substances.

The CVD apparatus for Cu formation described above should preferably include at least one of the following components, formed of a member containing metal which forms a fluoride by the reaction of the aforementioned raw material. The components may include a source container, a delivery system through which the raw material flows, a valve, a mass flow controller or pump for liquid delivery, a vaporizer, a shower head, a chamber, an exhaust line, a pump and so on.

When each component such as the source container mentioned above is formed of a member containing metal which forms a fluoride by the reaction with the raw material, a fluorinated metal is formed on the surface of each component while Cu film is formed. By the presence of this fluorinated metal, deposition of the substance resulting from the reaction on the surface of each component can effectively be suppressed.

Further, when the CVD apparatus for Cu formation includes a portion where a liquid raw material exists, it is preferred that the surface of the portion where the liquid raw material exists is formed of a material inactive against the decomposition of the liquid raw material.

When the surface of the portion where the liquid raw material exists is formed of a material inactive to the decomposition of the liquid raw material, decomposition of the liquid raw material on that surface can effectively be suppressed. Therefore, deposition of the substance resulting from the reaction at that portion where the liquid raw material exists can effectively be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1 to 5.
(First Embodiment)

Figure 1:
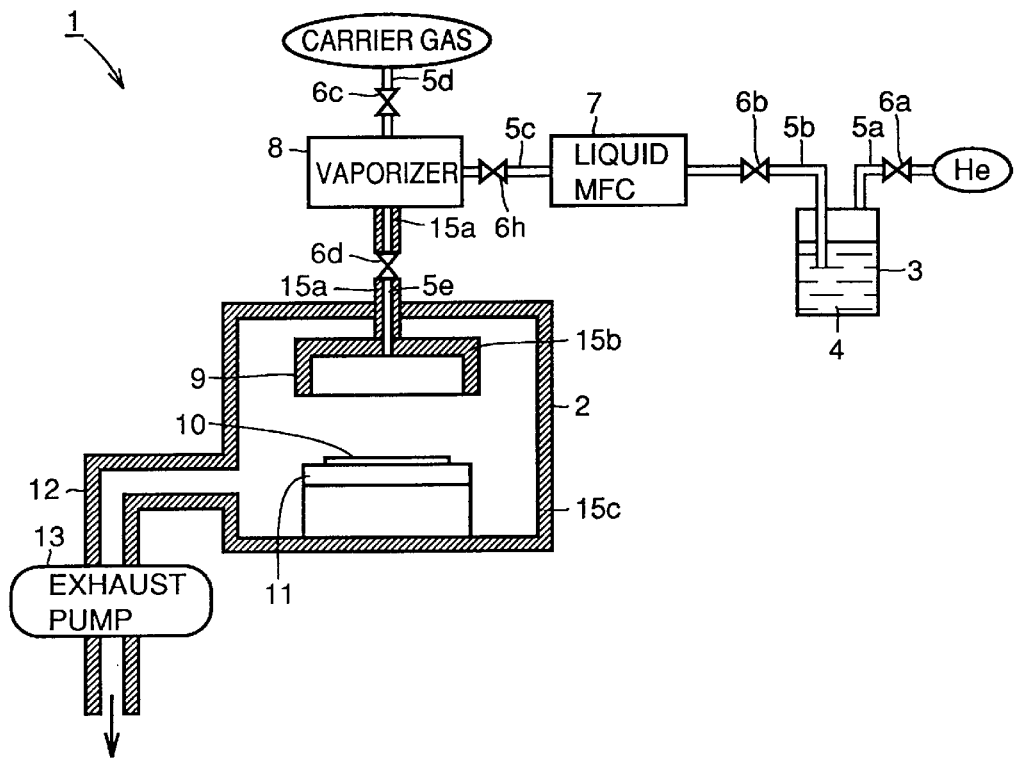
FIG. 1 shows a schematic structure of a direct liquid injection type CVD apparatus for Cu formation to which the present invention is applicable.

FIG. 1 shows a schematic structure of the CVD apparatus for Cu formation in accordance with the first embodiment of the present invention. The CVD apparatus shown in FIG. 1 is of the direct liquid injection type.

Referring to FIG. 1, CVD apparatus 1 in accordance with the first embodiment of the present invention includes a film forming chamber 2, a source container 3, a liquid mass flow controller 7, a vaporizer 8, and an exhaustion pipe 12 and exhaustion pump 13.

Source container 3 contains a raw material (Cu(HFA) (TMVS)) in liquid phase, and delivery lines 5a and 5b are connected to source container 3. Delivery lines 5a and 5b are provided with valves 6a and 6b, respectively. He is supplied to source container 3 through delivery line 5a, and raw material 4 in liquid phase is fed to liquid mass flow controller 7 through delivery line 5b.

A delivery line 5c is provided between liquid mass flow controller 7 and vaporizer 8, and the delivery line 5c is also provided with a valve 6h. The raw material 4 in liquid phase is fed from liquid mass flow controller 7 to vaporizer 8 through delivery line 5c. A delivery line 5d is further connected to vaporizer 8, and a carrier gas is fed to vaporizer 8 through delivery line 5d. Delivery line 5d is provided with a valve 6c. In another case, pump is used to supply the raw material. Flow rate of raw material is controlled by frequency of pump run.

A heater 11 for heating a substrate is placed in film forming chamber 2, and a semiconductor wafer 10 is mounted on heater 11. A shower head 9 is arranged above semiconductor wafer 10. Shower head 9 is connected to vaporizer 8 through a delivery line 5e, and through delivery line 5e and shower head 9, the raw material in gas phase is supplied to film forming chamber 2. Delivery line 5e is also provided with a valve 6d. On an outer periphery of delivery line 5e, a heater 15a for heating delivery line 5e to a prescribed temperature is provided. Further, a heater 15c is also provided on a wall surface of film forming chamber 2, and a heater 15b is provided on the surface of shower head 9. Between film forming chamber 2 and exhaust pump 13, an exhaust line 12 is provided, and a heater 15c is also provided on the wall surface of exhaust line 12.

The present invention is characterized in that a fluorinated organic polymer contained, a fluorinated metal, Ti, a Ti compound or an insulator is provided on surfaces of portions where the raw material exists in the above structure, that is, on inner surfaces of source container 3, delivery lines 5b, 5c, 5e, valves 6b, 6d, 6h, liquid mass flow controller 7, vaporizer 8, film forming chamber 2, shower head 9, exhaust line 12, exhaust pump 13 and so on as well as on the surface of shower head 9. More specifically, referring to FIG. 3, a coating layer 16 consisting of any of the aforementioned substances is formed on an inner surface of delivery line 5b, for example.

The fluorinated organic polymer contained may include polytetrafluoroethylene. The fluorinated metal may include a fluoride of Ti or Al, the insulator may include $Al_2O_3$, $SiO_2$, $Cr_2O_3$, AlN, SiN, and the Ti compound may include $TiO_2$ and TiN.

Figure 4:
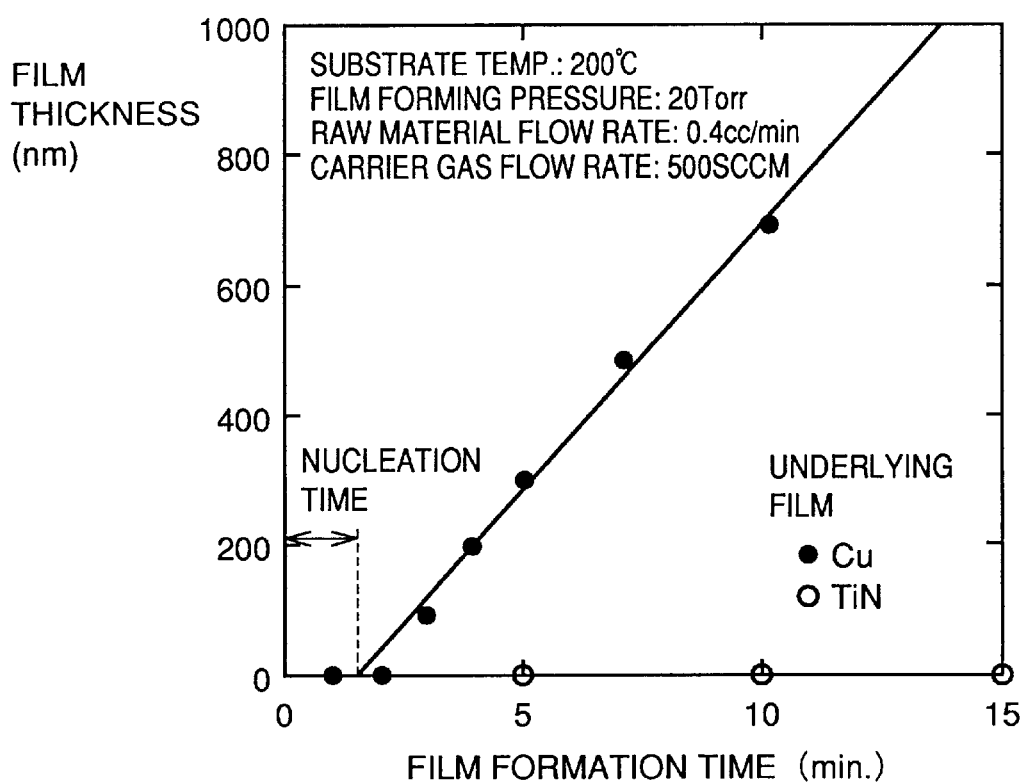
FIG. 4 is a graph showing relation between the time for Cu film formation and film thickness thereof, when Cu and TiN are selected as underlying layers.
Figure 5:
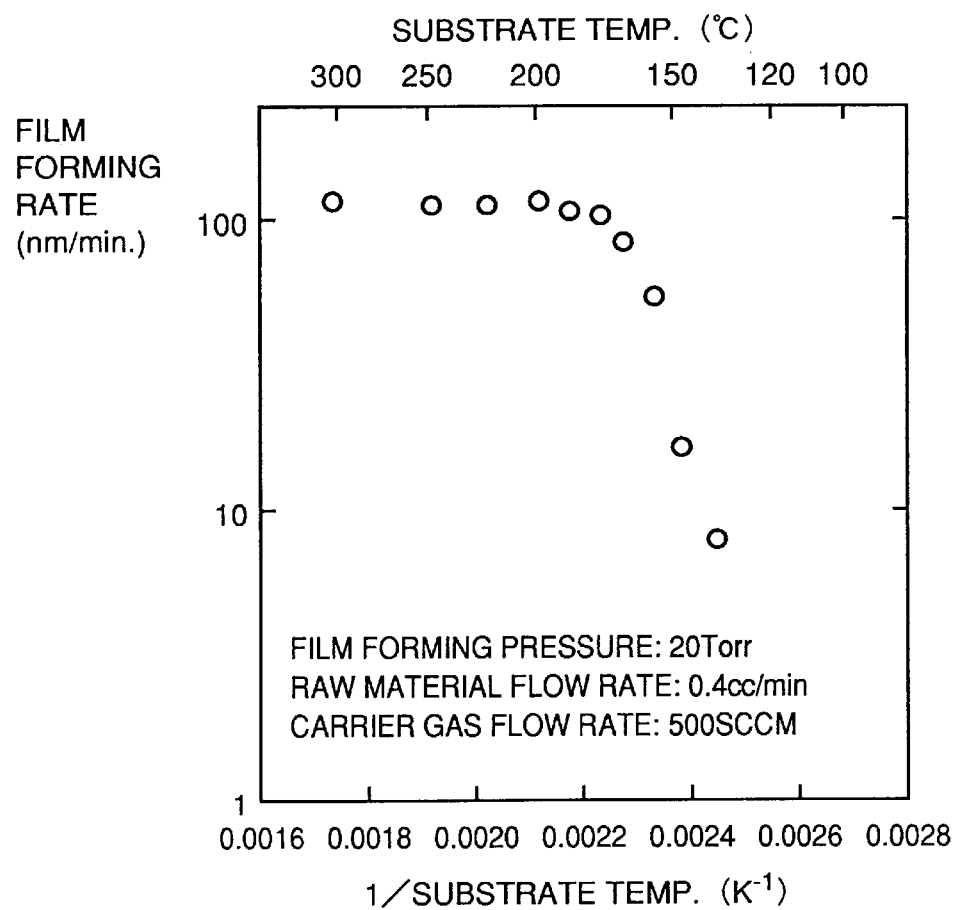
FIG. 5 is a graph showing relation between film forming rate of Cu and a substrate temperature.
Figure 6:
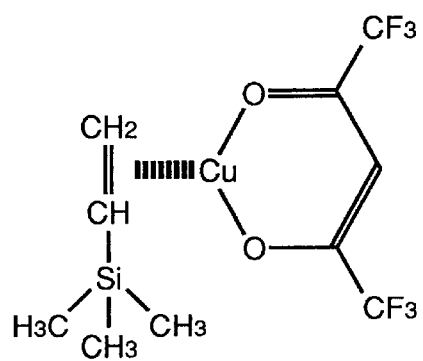
FIG. 6 shows a molecular structure of Cu(HFA)(TMVS).

Since a fluorinated organic polymer contained or the like exists on the surface of source container 3 or the like mentioned above, deposition of a substance such as Cu resulting from the reaction on the surface of each component can effectively be suppressed. The reason will be described with reference to FIGS. 4 and 5. FIG. 4 is a graph showing relation between the time for film formation and the film thickness when a Cu film is formed by using Cu(HFA)(TMVS) under the condition as listed in the figure, on an underlying layer of Cu or TiN, for example, formed on a substrate. FIG. 5 is a graph showing relation between film forming rate of Cu and a substrate temperature.

When Cu(HFA)(TMVS) is used as a raw material for forming a Cu film, the reaction in accordance with the chemical expression (2) described above proceeds. Here, Cu of Cu(HFA)(TMVS) is in a +1 oxidation state, the deposited Cu is in a 0 oxidation state and Cu of $Cu(HFA)_2$ is in a +2 oxidation state. In other words, the reaction of the chemical expression (2) exchanges electrons. Therefore, when the underlying layer is of a conductor, the underlying layer intervenes the exchange of electrons, and therefore reaction is facilitated as compared when the underlying layer is an insulator. Even when the underlying layer is an insulator, the reaction proceeds in the similar manner as when the underlying layer is a conductor if the surface of the insulator is covered with Cu. Therefore, initial reaction when the surface of the underlying layer is exposed is of critical importance. For the reaction to proceed here, the distance between two Cu(HFA)(TMVS) absorbed to the underlying layer must be extremely short enough to allow exchange of electrons therebetween. Therefore, possibility of reaction is very small. For this reason, when the underlying layer is an insulator, it is considered that Cu film is hardly deposited.

The reaction represented by the chemical expression (2) is hindered especially when the surface is turned to fluoride. The reason for this may be the fact that fluorine has high electronegativity and hence exchange of electrons is hindered between two Cu(HFA)(TMVS) through a conductive substrate. Further, on a fluorinated surface, bonds on the surface are terminated by fluorine, exhibiting the effect of suppressing absorption of Cu(HFA)(TMVS). By these effects, absorption of Cu(HFA)(TMVS) and exchange of electrons between go Cu(HFA)(TMVS) are suppressed, so that the entire reaction is suppressed. Such effects on the surface are similarly observed when fluorine is contained in the material, as in the case of polytetrafluoroethylene, for example.

It is considered that deposition of a substance such as Cu resulting from the reaction on the surface of each component can effectively be suppressed when a fluorinated organic polymer contained, a fluorinated metal or an insulator exists on the surface of source container 3 and the like mentioned above, in accordance with the principle described above. The inventors conducted an experiment to form Cu by the CVD method using Cu(HFA)(TMVS) on surfaces of various underlying films, so as to confirm the above described principle. Table 1 below shows the results of experiment.

TABLE 1

| Underlying Film | Result of Film Formation |
| --- | --- |
| Cu | ○ |
| W | ○ |
| Polytetrafluoroethylene | x |
| Ti | x |
| TiN | x |
| $SiO_2$ | x |

As can be seen from Table 1, Cu is not formed on the surface when a fluorinated organic polymer contained such as polytetrafluoroethylene, a Ti compound such as TiN or an insulator such as SiO2 is used as the underlying layer. Cu is not formed either when the underlying film is Ti. As for Ti, Cu film is not formed on the surface because a stable fluoride is formed with Cu(HFA)(TMVS). Therefore, it is considered that when a fluorinated metal exists on a surface, Cu film formation on the fluorinated metal is hindered.

FIG. 4 shows relation between the time of film formation and film thickness of Cu when Cu and TiN are selected as underlying layers, among the results shown in Table 1. As can be seen from FIG. 4, when the underlying layer is of Cu, Cu film is formed gradually after the lapse of nucleation time, while Cu film is not at all formed when the underlying film is of TiN.

FIG. 4 shows data when the substrate temperature was 200° C. Referring to FIG. 5, the rate of film formation of Cu increases as the substrate temperature increases and the rate attains the maximum value at about 200° C. The rate of film formation does not change further even when the substrate temperature is further increased. Based on this result, it is considered that when the substrate temperature is not higher than about 300° C., the results shown in FIG. 4 would be obtained at any temperature.

In view of the foregoing, it is considered that deposition of a substance such as Cu resulting from the reaction on the surface of each component can effectively be suppressed when a fluorinated organic polymer contained, a fluorinated metal, Ti, a Ti compound or an insulator exists on the surface of each component such as source container 3 mentioned above.

Further, based on the same principle as described above, it is considered that deposition of a substance resulting from the reaction on the surface of each component can effectively be suppressed when each component such as source container 3 mentioned above is formed of a member containing a metal which forms a fluoride by the reaction with the raw material for Cu formation such as Cu(HFA)(TMVS).

When the surface of a portion where a liquid raw material exists is formed of a substance inactive to the decomposition of the liquid raw material, deposition of the substance resulting from the reaction on the surface of that portion can effectively be suppressed. Here, the member where the liquid raw material exists should be formed of a material not having a catalytic function. More specifically, an insulator such as $SiO_2$, $Al_2O_3$, SiN or the like may be used. A material which cannot be used for the portion where the liquid raw material exists includes Ni, W or a noble metal such as Pt.

In the first embodiment described above, Cu(HFA)(TMVS) is used as an example of the liquid raw material for forming Cu film. The liquid raw materials or solid raw materials listed in Table 2 below may be used.

TABLE 2

[Liquid Raw Material]

| | |
|---|---|
| Cu(HFA)(TMVS): | Hexafluoroacetylacetonate Copper Trimethylvinyl Silane adduct |
| Cu(HFA)(TMVS) + TMVS: | Hexafluoroacetylacetonate Copper Trimethylvinyl Silane adduct + Trimethylvinyl Silane |
| Cu(HFA)($C_{10}H_{16}$): | Hexafluoroacetylacetonate Copper Dimethylcyclooctadiene Silane adduct |
| Cu(HFA)($C_6H_{10}$): | Hexafluoroacetylacetonate Copper 3-hexune adduct |
| Cu(HFA)($C_7H_{10}$): | Hexafluoroacetylacetonate Copper 3-heptyne adduct |
| Cu(HFA)(P($C_2H_5$)$_3$): | Hexafluoroacetylacetonate Copper Triethylphosphine adduct |

[Solid Raw Material]

| | |
|---|---|
| Cu(HFA)$_2$: | Bis Hexafluoroacetylacetonate Copper Trimethylvinyl Silane |
| Cu(HFA)($C_8H_{12}$): | Hexafluoroacetylacetonate Copper Cyclooctadiene adduct |
| Cu(HFA)(($CH_3$)$_3$SiC)$_2$: | Hexafluoroacetylacetonate Copper Bistrimethylsilylacetylene adduct |
| Cu(HFA)(($CH_3$)$_3$C)$_2$: | Hexafluoroacetylacetonate Copper 2-Butyne adduct |
| Cu(HFA)($C_8H_{12}$): | Hexafluoroacetylacetonate Copper 1,5-Cyclooctadiene adduct |

(Second Embodiment)

Figure 2:
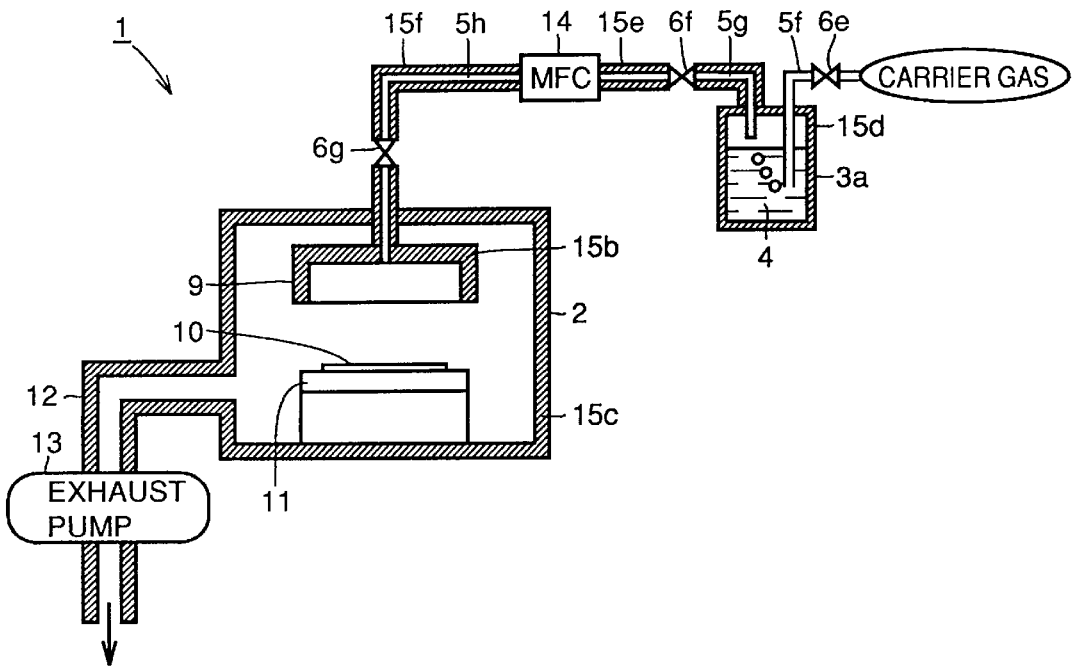
FIG. 2 shows a schematic structure of a bubbling type CVD apparatus for Cu formation to which the present invention is applicable.
Figure 3:
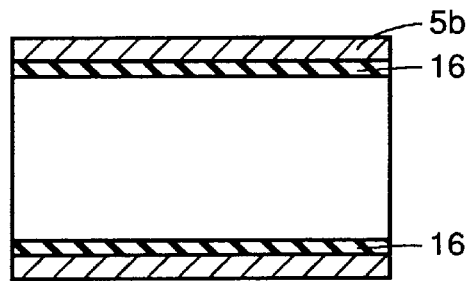
FIG. 3 is a partial cross section of a delivery line on which a coating layer in accordance with the present invention is formed.

A second embodiment of the present invention will be described with reference to FIG. 2. FIG. 2 shows a schematic structure of a CVD apparatus for Cu formation in accordance with the second embodiment.

Referring to FIG. 2, CVD apparatus 1 shown in this figure is a bubbling type CVD apparatus. As shown in FIG. 2, CVD apparatus 1 includes a source container 3a, chamber 2, mass flow controller 14 and exhaust pump 13.

A heater 15d is provided on a wall surface of source container 3a. In this example, source container 3a contains Cu(HFA)(TMVS) in liquid phase as raw material 4 as well as a solvent. Delivery lines 5f and 5g are connected to source container 3a. Delivery line 5f is provided with a valve 6e, and a carrier gas is fed to source container 3a through delivery line 5f.

Raw material 4 in gas phase is fed to mass flow controller 14 through delivery line 5g. Delivery line 5g is also provided with a valve 6f. A heater 1e is mounted on a wall surface of delivery line 5g.

Between mass flow controller 14 and shower head 9, a delivery line 5h is provided. A heater 15f is provided on the wall surface of delivery line 5h. Delivery line 5h is also provided with a valve 6g. Structure of film forming chamber 2, exhaust line 12 and exhaust pump 13 are the same as those of the first embodiment described above. Therefore, description thereof is not repeated.

In the bubbling type CVD apparatus 1 having the above described structure, a fluorinated organic polymer contained, a fluorinated metal, Ti, a Ti compound or an insulator is provided on the surface of a member where the raw material exists, as in the first embodiment described above.

More specifically, the fluorinated organic polymer contained or other substance mentioned above is provided on the inner surface of source container 3a, inner surfaces of delivery lines 5g and 5h, inner surface of mass flow controller 14, inner surfaces of valves 6f and 6g, the surface of shower head 9, an inner surface of film forming chamber 2, an inner surface of exhaust line 12, an inner surface of exhaust pump 13 and so on. Accordingly, from the same principle as described in the first embodiment above, deposition of a substance such as Cu resulting from the reaction on the surface of each component can effectively be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A CVD apparatus for depositing Cu, the CVD apparatus comprising a source container containing a mixture of a solvent and a liquid raw material including Cu hexafluoroacetylacetonate (HFA) and adducted molecules, or a solid raw material including Cu(HFA) and adducted molecules, wherein at least one component of the CVD apparatus has a surface with a fluorinated organic polymer, a fluorinated metal, an insulator or a Ti compound thereon at a portion where said raw material exists.

2. The CVD apparatus according to claim 1, wherein:

said at least one component is selected from the group consisting of the source container, a delivery line through which said raw material flows, a valve, a mass flow controller or pump for liquid delivery, a vaporizer, a shower head, a chamber, an exhaust line and a pump; and an inner wall surface of each said component is covered with the fluorinated organic polymer, fluorinated metal, insulator, Ti, or Ti compound.

3. The CVD apparatus according to claim 1, wherein said fluorinated metal includes a fluoride of Ti or Al, said insulator includes $Al_2O_3$, $SiO_2$, $Cr_2O_3$, AlN and SiN, and said Ti compound includes $TiO_2$ and TiN.

4. The CVD apparatus according to claim 1, comprising at least one component selected from the group consisting of the source container, a delivery line through which said raw material flows, a valve, a mass flow controller or pump for liquid delivery, a vaporizer, a shower head, a chamber, an exhaust line and a pump, formed of a member containing a metal which forms a fluoride by a reaction with said raw material.

5. The CVD apparatus according to claim 1, comprising a portion where said raw material exists as a liquid, wherein a surface of the portion where the liquid raw material exists is formed of a substance inactive to decomposition of the liquid raw material.

* * * * *